US006369592B1

(12) United States Patent
Majka et al.

(10) Patent No.: US 6,369,592 B1
(45) Date of Patent: *Apr. 9, 2002

(54) PROBE FOR TESTING AND REPAIRING PRINTED CIRCUIT FEATURES

(75) Inventors: Christopher J. Majka, Owego; Matthew Seward, Windsor, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,393

(22) Filed: May 24, 1999

(51) Int. Cl.$^7$ .............................................. G01R 31/02
(52) U.S. Cl. ..................... 324/754; 324/761; 324/158.1
(58) Field of Search ................................ 324/762, 754, 324/757, 758, 72.5, 761, 158.1

(56) References Cited

U.S. PATENT DOCUMENTS

| 4,123,706 A | * 10/1978 | Roch ........................... 324/754 |
| 4,151,462 A | 4/1979 | Teyler |
| 4,151,465 A | * 4/1979 | Lenz ........................... 324/754 |
| 4,267,507 A | 5/1981 | Guerpont |
| 4,362,991 A | 12/1982 | Carbine |
| 4,471,298 A | 9/1984 | Frohlich |
| 4,845,427 A | 7/1989 | Hultin |
| 4,847,553 A | * 7/1989 | Seinecke ..................... 324/756 |
| 4,956,923 A | * 9/1990 | Pettingell et al. ....... 324/757 X |
| 4,992,728 A | 2/1991 | McCord et al. |
| 5,043,656 A | 8/1991 | Clark |
| 5,075,621 A | * 12/1991 | Hoyt ........................... 324/762 |
| 5,446,393 A | * 8/1995 | Schaefer ..................... 324/754 |
| 5,457,392 A | 10/1995 | Filipescu |
| 5,701,175 A | 12/1997 | Kostizak et al. |
| 6,040,705 A | * 3/2000 | Garcia et al. ............... 324/762 |

FOREIGN PATENT DOCUMENTS

| JP | 01-257343 | 10/1989 |
| JP | 02-087644 | 3/1990 |
| RU | 585562 | 1/1978 |

OTHER PUBLICATIONS

L. Smith et al., IBM Technical Disclosure Bulletin; Probe Holder; Vo. 12, No. 9, 2/70 pp. 1373–1374.

* cited by examiner

Primary Examiner—Safet Metjahic
Assistant Examiner—T. R. Sundaram
(74) Attorney, Agent, or Firm—McGuireWoods LLP; Lawrence Fraley

(57) ABSTRACT

A handheld probe for testing and monitoring features and pads on circuit boards and other electrical components is provided. The handheld probe includes a probe base having a probe connected to any type of meter, instrument or display and the like. The probe is positioned at an angle away from the probe base and is held in its angled position with respect to the probe base by a probe holder and a probe clamp. Upper and lower cantilever springs are positioned within a hollowed portion of the probe base, and provide a spring return of the probe when a push button is released from its depressed position. A spacer is provided between the upper and lower cantilever springs.

19 Claims, 3 Drawing Sheets

PROBE FOR TESTING AND REPAIRING PRINTED CIRCUIT FEATURES

BACKGROUND OF THE INVENTION

1. Field of the Invention

The present invention generally relates to a probe for testing and, more particularly, to a handheld probe for use in manual electrical testing of small printed circuit features.

2. Background Description

In order to provide reliable and robust printed circuit boards, chip carriers, flex circuits, circuit cards or delicate and small featured items that require touch by a probe or other contacting apparatus (collectively known as circuit boards), it is essential that these circuit boards be tested prior to being placed in the marketplace. Testing of these circuit boards typically consists of manually testing the printed circuit features on the printed circuit boards with a handheld meter or probe. These meters and/or probes test for defects in the circuit board, such as, for example, electrical shorts and the like.

Current testing methods include handheld pencil-like probes that are moveable in the "x", "y" and "z" direction, and which are prone to shaking, movement and the like during testing of the circuit board. Due to the shaking and movement of the probe, usually caused by the shaking of the operator's hand, the probe itself has a tendency to often damage the line or pad under test. This is especially true when the features of the circuit board are small and densely packed on the circuit board, such as, for example, 4 mil or less.

SUMMARY OF THE INVENTION

It is therefore an object of the present invention to substantially reduce movement in an "x" and "y" direction.

It is a further object of the present invention to prevent physical damage to a device under test or repair.

In order to accomplish the objectives of the present invention, a handheld probe for testing and repairing features and pads on circuit boards and other electrical components is provided. The handheld probe includes a probe base having a probe connected to any type of meter, instrument or display and the like. The probe is positioned at an angle away from the probe base and adjusted to a height slightly above the board being tested. This allows he probe tip as well as the object being tested to be within the focal length of a microscope so that the feature being tested or repaired under a microscope and the probe tip can be easily seen at the same time. The probe is held in its angled position with respect to the probe base by a probe holder and a probe clamp.

Upper and lower cantilever springs are positioned within a hollowed portion of the probe base. The upper and lower cantilever springs connect to the probe holder, and provide a spring return of the probe when a push button is released from its depressed position. A spacer is provided between the upper cantilever spring and the lower cantilever spring, and the push button is positioned over the upper cantilever spring.

The bottom surface of the base firmly holds the probe base in the "x" and "y" directions during testing of the circuit board when a slight pressure is placed on the probe base. A wire connects at one end to the probe and at another end to a meter, instrument or display and the like.

The probe holder includes a housing which is positioned between the upper and lower cantilever springs. An angled extension extends outward from the housing and away from the upper and lower cantilever springs. A holder extends outward from the angled extension and includes a notch. The probe is placed within the notch and the probe clamp holds the probe in place with respect to the probe holder.

In use, the base of the present invention, held down with slight pressure, prevents any unwanted movement in the "x" and "y" direction thus eliminating any damage to the feature on the printed circuit board or the like.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a handheld probe for testing or monitoring pads or features on circuit boards and other electrical components. The handheld probe of the present invention may also measure circuit lines for impedance, resistance, capacitance or mere monitoring of the circuit board. The base of the handheld probe has a low center of gravity, and further has a low coefficient of friction thus preventing damage to circuitry when sliding across the tested circuit substrate and the like.

Specifically, a probe tip of the handheld base is preferably focused under a microscope and is moveable in a downward direction (e.g., "z" direction) by a force applied to a lever or button of the handheld base to thereby mate with the device under test. The probe tip is capable of returning to its original position when the force is no longer applied to the lever or button. The handheld base is held firmly in the "x" and "y" direction by simply placing a slight pressure on the base itself.

By using the handheld base of the present invention, the probe tip can be lowered onto a small feature circuit line or pad at the push of a button, while the handheld base is held firmly in the "x" and "y" direction. Because there is no movement in either the "x" or "y" direction when the probe is lowered onto the feature, there is no gouging or scratching caused to the feature during testing thereof.

Figure 1:
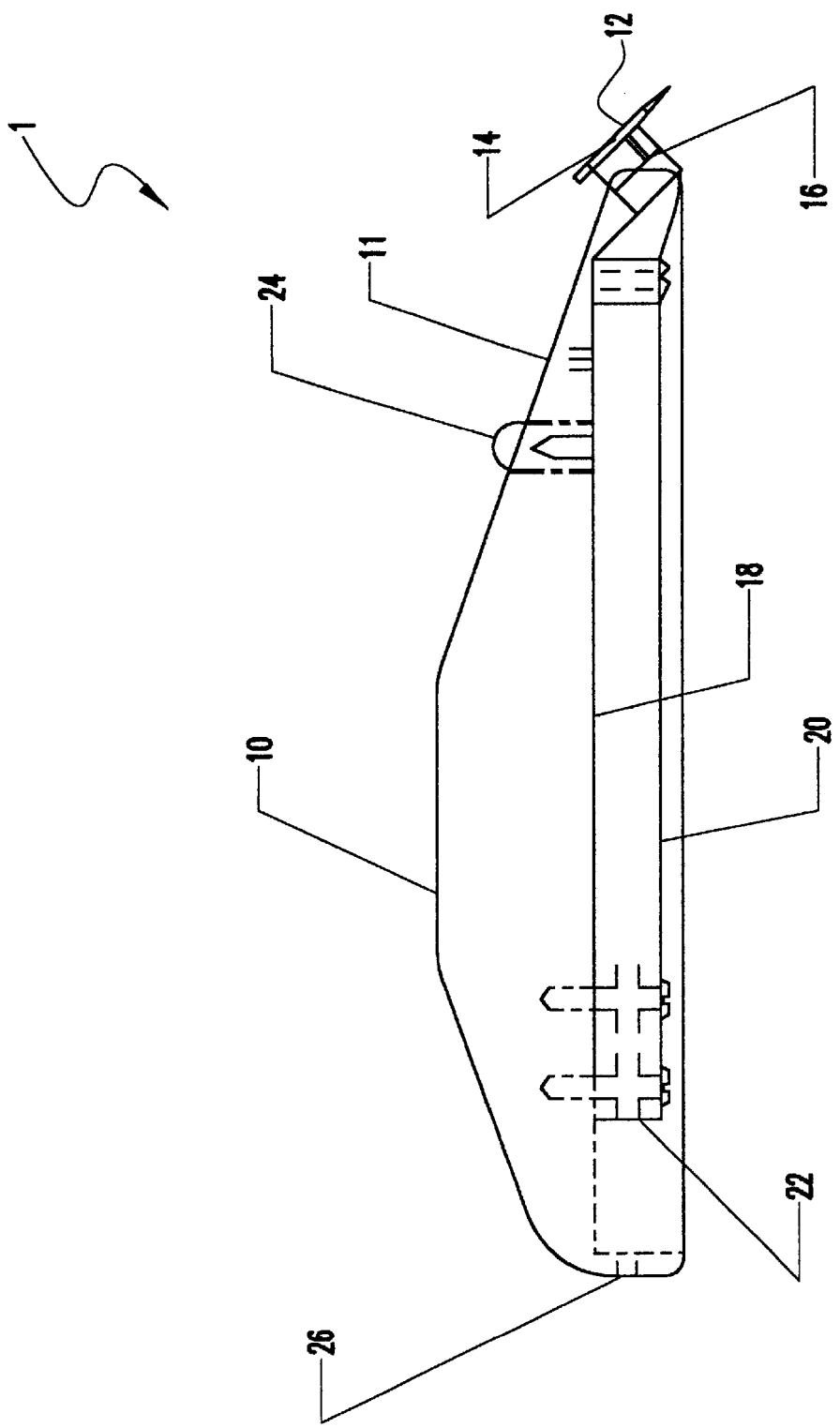
FIG. 1 shows a side elevational view of the probe of the present invention.

Referring now to the drawings, and more particularly to FIG. 1, there is shown a side cut-away view of the probe of the present invention. The probe 1 includes a probe housing or base 10 having a hollowed portion and is preferably shaped as a computer mouse. At one end of the handheld base 10 is a substantially vertical direction probe 12 which may be connected to any type of meter, instrument or display and the like.

In the preferred embodiment, the probe 12 is positioned at an angle away from the probe base 10 so that the feature being tested or monitored under a microscope and the probe tip can be easily seen at the same time. The probe 12 is held in its angled position with respect to the probe base 10 by a probe holder 14 and a probe clamp 16. In the preferred embodiment, the probe holder 14 is positioned between upper and lower cantilever springs 18 and 20 or other well known spring devices, and the probe holder 14 and the probe clamp 16 are adjustable with respect to the probe base 10 by use of a probe adjustment 11. The probe adjustment 11 permits the probe 12 to be properly positioned with respect to a tested or monitored feature on the circuit board and the like.

Still referring to FIG. 1, the upper and lower cantilever springs 18 and 20 are positioned within the hollowed portion of the probe base 10 and connect to the probe holder 14. The upper and lower cantilever springs 18 and 20 allow the probe 12 to move in a substantial vertical direction, and further provide a spring return of the probe 12 when a push button 24 is released from its depressed position. A spacer 22 is provided between the upper cantilever spring 18 and the lower cantilever spring 20 in order to maintain a substantially parallel relation between the upper and lower cantilever springs 18 and 20, and the push button 24 is positioned over the upper cantilever spring 18. In the embodiments of the present invention, the spacer 22 may be mounted between the upper and lower cantilever springs 18 and 20 by any well known method, such as, for example, glue, screws, rivets and the like. Moreover, the push button 24 may be mounted to the upper cantilever spring 18 and may include a spacer between the upper cantilever spring 18 and the push button 24.

A wire 26 connects to the probe 12 at one end and connects to a meter, instrument or display and the like at the other end. In the embodiments of the present invention, the wire 26 may be connected to either one of the upper and lower cantilever springs 18 and 20, or may be equally connected to the probe holder 14. In these cases, the upper and lower cantilever springs 18 and 20 or the probe holder 14 are conductors and may be comprised of steel and brass, respectively, and the probe 12 may be beryllium copper. It is contemplated that other ferrous or non ferrous (except for the probe 12) materials well known to one skilled in the art of probe technology may be used by the present invention.

Figure 2:
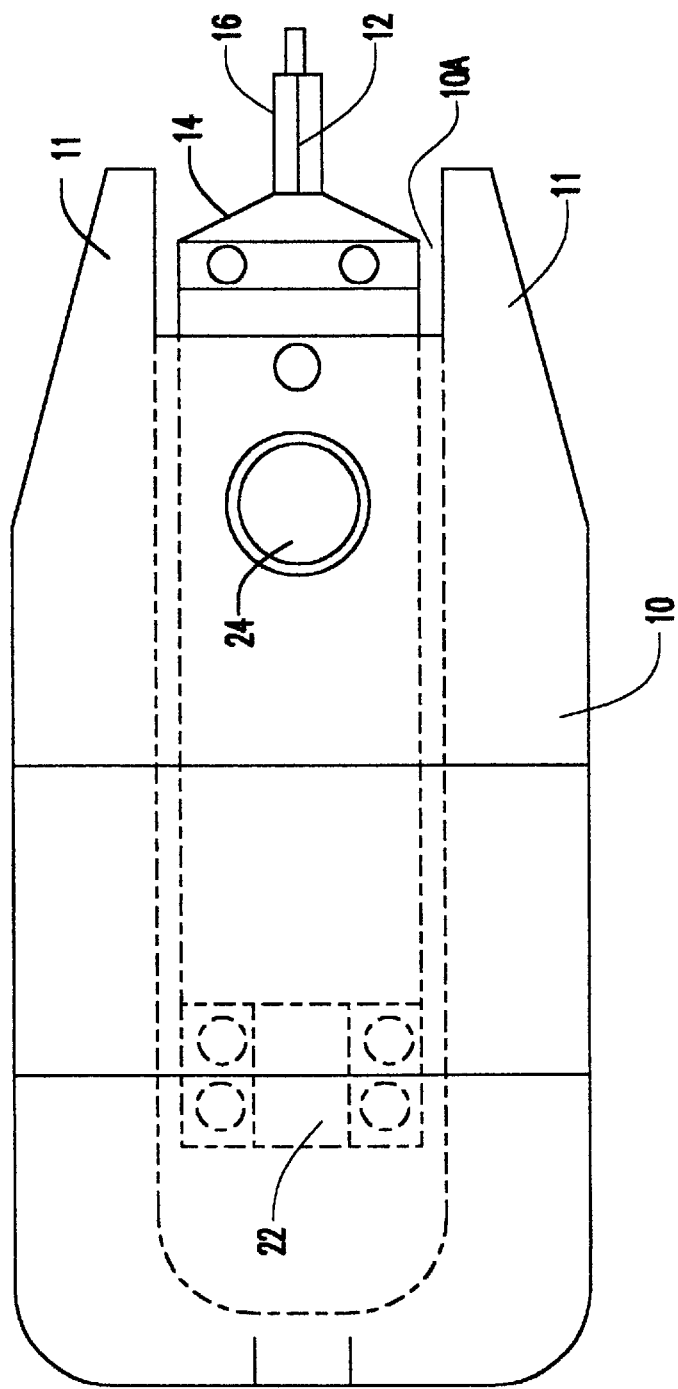
FIG. 2 shows a top view of the probe base.

FIG. 2 shows a top view of the probe base 10. As seen in FIG. 2, the probe base 10 preferably includes opposing outward extending probe guards 11. In the preferred embodiment, the probe holder 14, probe clamp 16 and probe 12 are positioned between the probe guards 11, and at least the probe 12 extends slightly beyond ends of the probe guards 11 so that the probe 12 and the feature being tested or monitored under a microscope can be easily seen at the same time. In this manner, the probe guards 11 protect the probe holder 14, probe clamp 16 and probe 12 during use of the present invention However, it is well understood that the probe holder 14 and the probe clamp 16 may be connected to an end portion of the probe base 10 (and not between the probe guards). Moreover, the push button 24 and the upper and lower cantilever springs 18 and 20 are preferably aligned between the probe guards 11; however, the alignment of the push button 24 and the upper and lower cantilever springs 18 and 20 may be offset with respect to the probe guards 11.

FIG. 2 further shows the spacer 22 preferably positioned substantially at an end portion and between the upper and lower cantilever springs 18 and 20. However, the spacer 22 may be positioned at other locations.

Figure 3:
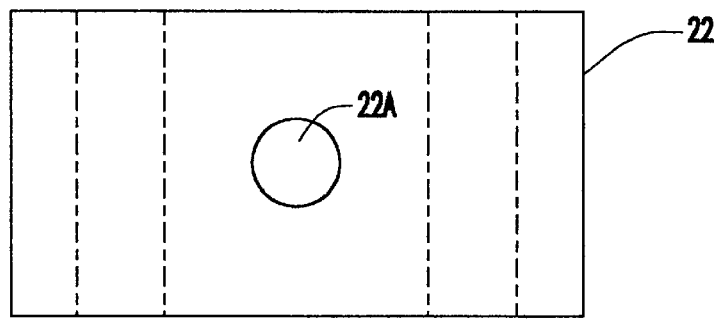
FIG. 3 shows a side view of a spacer of the probe of the present invention.

FIG. 3 shows a side view of the spacer 22. In the embodiments of the present invention, the spacer 22 includes a bore 22a in which the wire 26 can extend therethrough. In this manner, the wire 26 can further extend between the upper and lower cantilever springs 18 and 20 so as to connect to the probe 12. The spacer 22 is preferably comprised of aluminum, but any appropriate material such as, for example, steel or non ferrous materials and the like may be used for the spacer 22.

Figure 4:
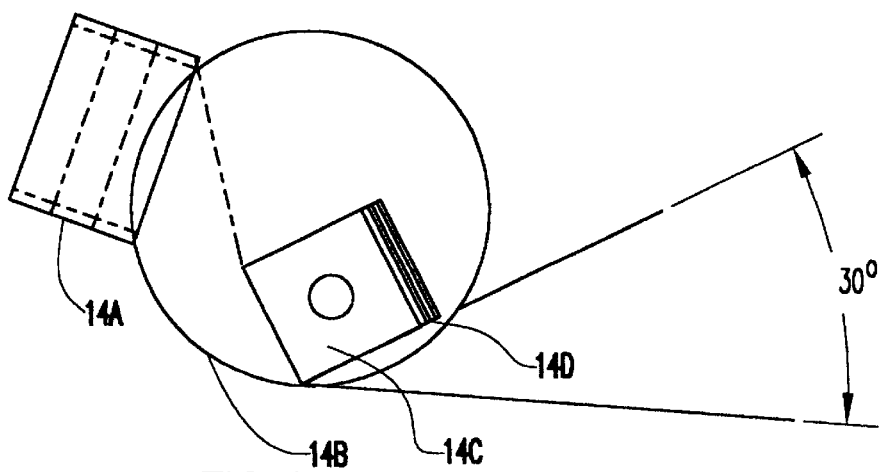
FIG. 4 shows a side view of a probe holder of the probe of the present invention.

FIG. 4 shows a side view of the probe holder 14. The probe holder 14 includes a housing 14a which is positioned between the upper and lower cantilever springs 18 and 20, and preferably has a same height as the spacer 22. An angled extension 14b extends outward from the housing 14a and away from the upper and lower cantilever springs 18 and 20. A holder 14c extends outward from the angled extension 14b and includes a notch 14d, preferably "v" shaped. In the preferred embodiment, the holder 14c is mounted to the angled extension 14b at a substantially 30 degree angle with respect to a horizontal plane of a bottom surface of the housing 14a.

Figure 5:
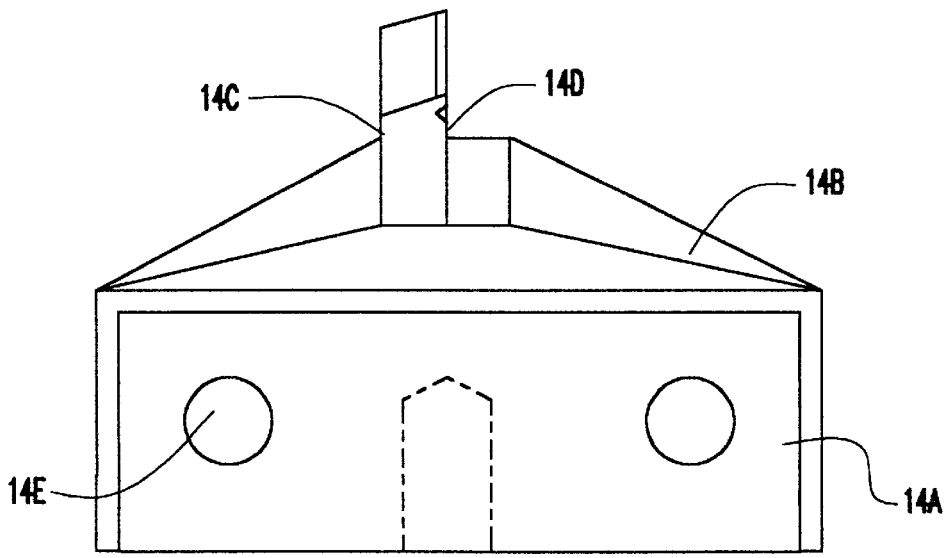
FIG. 5 shows a top view of the probe holder.

FIG. 5 shows an upper view of the probe holder 14. As seen more clearly in FIG. 5, the holder 14c extends outward from the angled extension 14b and includes the "v" shaped notch 14d. The probe 12 is placed within the notch 14d and is held in place by the probe clamp 16.

In the embodiments of the present invention, the housing 14a includes screw or rivet holes 14e. The screw or rivet holes 14e accommodate screws or rivets, respectively, which attach the housing 14a to the upper and lower cantilever springs 18 and 20. However, other mounting means, such as glue, welding and the like may be used to mount the probe holder 14 to the upper and lower cantilever springs 18 and 20.

In use, the probe 12 is first aligned with a feature on the circuit board. Once alignment is accomplished, a slight pressure is placed on the probe body 10 to firmly hold the probe base 10 in the "x" and "y" directions during testing or monitoring of the circuit board. The operator then depresses the push button 24 so as to bias the upper and lower cantilever springs 18 and 20 in the downward direction. This, in turn, lowers the probe 12 onto a feature circuit line or pad of the printed circuit board or the like. At this time, testing, monitoring or other similar action can be provided to the feature on the circuit board. When the push button 24 is depressed, the spacer 22 (and the probe holder 14) maintains a bias between the upper and lower cantilever springs 18 and 20 so that upon release of the push button 24, the probe 12 is returned to its original position. By using the handheld probe of the present invention, unwanted movement in the "x" and "y" direction is prevented thus eliminating any damage to the feature on the printed circuit board or the like.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A probe for testing or monitoring features on a circuitized feature comprising:
   a housing movably positioned in a first direction and a second direction orthogonal to the first direction in a horizontal plane on a circuitized surface, the housing having a hollow interior portion;
   a holder having a notch, the holder being positioned on an exterior of the housing;
   a probe extending outward from the housing and being coupled to the holder in the notch, the probe movable in a substantially vertical direction in order to contact the circuitized feature when in a lowered position;

opposing probe guards extending from the housing and positioned on opposing sides of the probe, the probe extending beyond the opposing outward extending probe guards;

opposing cantilever springs positioned within the interior portion of the housing and connecting to the probe, the opposing cantilever springs vertically biasing the probe in the lowered position and returning the probe to an original position;

a spacer positioned between the opposing cantilever springs; and a push button contacting an upper cantilever spring of the opposing cantilever springs, the push button being biased in a first position by the upper cantilever spring and capable of forcing the opposing cantilever springs in a direction which moves the probe in the vertical position.

2. A probe for testing or monitoring features on a circuitized feature comprising:

a handheld housing movably positioned in a first direction and a second direction orthogonal to the first direction in a horizontal plane on a circuitized surface;

a probe extending outward from the handheld housing, the probe movable in a substantially vertical direction in order to contact the circuitized feature when in a lowered position; and opposing springs positioned within an interior portion of the handheld housing and connecting to the probe, the opposing springs vertically biasing the probe in the lowered position and returning the probe to an original position away from contact with the circuitized feature.

3. The probe of claim 2, wherein the probe is connected to a device to electrically test or monitor portions of the circuitized feature.

4. The probe of claim 2, wherein the probe is positioned at an angle with respect to the handheld housing.

5. The probe of claim 4, wherein the angle is approximately 30 degrees with respect to a horizontal plane of a bottom surface of the handheld housing.

6. The probe of claim 2, wherein the handheld housing has a low center of gravity and prevents damage to the circuitized feature when sliding across the circuitized surface.

7. The probe of claim 2, wherein the probe is focused under a microscope and is moved in the substantially vertical direction by a force applied to a lever or button located on the handheld housing.

8. The probe of claim 2, wherein the handheld housing is firmly held in the first direction and the second direction by placing pressure on the handheld housing when the probe is lowered onto the feature, thereby preventing damage to the circuitized feature.

9. The probe of claim 2, wherein the opposing springs includes an upper cantilever spring and a lower cantilever spring positioned within the handheld housing and contacting the probe.

10. The probe of claim 9, wherein
the upper and lower cantilever springs provide a substantial vertical positioning of the probe, and
the upper and lower cantilever springs provide a spring return for the probe after testing or monitoring of the circuitized feature.

11. The probe of claim 9, further comprising a spacer between the upper and lower cantilever springs, the spacer maintains a parallel position between the upper and lower cantilever springs.

12. The probe of claim 11, further comprising a holder for holding the probe and positioned between the upper and lower cantilever springs, the holder maintaining a parallel position between the upper and lower cantilever springs.

13. The probe of claim 12, wherein the holder extends outward from the handheld housing and includes an angled extension and a notch, the notch housing the probe.

14. The probe of claim 12, wherein the spacer and the holder have substantially a same height and assist in providing the substantial vertical positioning of the probe.

15. The probe of claim 11, wherein the spacer includes a bore in which a wire extends therethrough, the wire connecting to the probe.

16. The probe of claim 9, further comprising a push button or lever communicating with the upper cantilever spring in order to position the probe over the circuitized feature.

17. The probe of claim 16, further comprising a button spacer between the upper cantilever spring and the push button.

18. The probe of claim 2, wherein
the handheld housing includes opposing outward extending probe guards, the probe being positioned between the opposing outward extending probe guards and extending beyond an end portion of the opposing outward extending probe guards.

19. The probe of claim 18, wherein the opposing springs are an upper cantilever spring and a lower cantilever spring positioned within the housing and aligned with the opposing outward extending probe guards.

* * * * *